United States Patent
Aoyama et al.

(10) Patent No.: US 8,686,384 B2
(45) Date of Patent: Apr. 1, 2014

(54) MEMORY DEVICE AND METHOD FOR MANUFACTURING THE SAME

(75) Inventors: Kenji Aoyama, Kanagawa-ken (JP); Kazuhiko Yamamoto, Kanagawa-ken (JP); Satoshi Ishikawa, Kanagawa-ken (JP); Shigeto Oshino, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 13/052,426

(22) Filed: Mar. 21, 2011

(65) Prior Publication Data
US 2012/0104352 A1 May 3, 2012

(30) Foreign Application Priority Data
Nov. 2, 2010 (JP) ................................ 2010-246525

(51) Int. Cl.
*H01L 21/00* (2006.01)
(52) U.S. Cl.
USPC ............................ 257/2; 257/4; 257/E45.001
(58) Field of Classification Search
USPC .................... 257/2, 4, E45.001; 977/472, 943
See application file for complete search history.

(56) References Cited

U.S. PATENT DOCUMENTS

| | | | |
|---|---|---|---|
| 7,733,685 B2* | 6/2010 | Scheuerlein et al. | 365/148 |
| 8,264,866 B2* | 9/2012 | Fukumizu et al. | 365/148 |
| 8,334,525 B2* | 12/2012 | Nakai et al. | 257/2 |
| 8,507,888 B2* | 8/2013 | Aoyama et al. | 257/2 |
| 2010/0276656 A1* | 11/2010 | Sinha et al. | 257/3 |
| 2011/0012081 A1* | 1/2011 | Yoon et al. | 257/2 |

OTHER PUBLICATIONS

U.S. Appl. No. 12/973,183, filed Dec. 20, 2010, Shigeto Oshio.
U.S. Appl. No. 13/018,765, filed Feb. 1, 2011, Kenji Aoyama, et al.

* cited by examiner

*Primary Examiner* — William D Coleman
*Assistant Examiner* — Nicholas Tobergte
(74) *Attorney, Agent, or Firm* — Oblon, Spivak, McClelland, Maier & Neustadt, L.L.P.

(57) ABSTRACT

According to one embodiment, a memory device includes a nanomaterial assembly layer, a first electrode layer and a second electrode layer. The nanomaterial assembly layer is formed of an assembly of a plurality of micro conductors via gaps between the micro conductors. The first electrode layer is provided on the nanomaterial assembly layer. The second electrode layer is provided on the first electrode layer.

6 Claims, 9 Drawing Sheets

US 8,686,384 B2

MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2010-246525, filed on Nov. 2, 2010; the entire contents of which are incorporated herein by reference.

FIELD

Embodiments described herein relate generally to a memory device and a method for manufacturing the same.

BACKGROUND

In recent years a phenomenon has been discovered in which certain metal oxide-based materials can have a low resistance state and a high resistance state when a voltage is applied, depending on the resistivity prior to application of the voltage and the magnitude of the applied voltage. Interest has been focused on new nonvolatile memory devices that use this phenomenon. This nonvolatile memory device is referred to as a Resistance Random Access Memory (ReRAM). A 3-dimensional cross-point structure has been proposed for the structure of an actual ReRAM device, in which memory cells are disposed at the intersection points of word lines (WL) and bit lines (BL), from the point of view of large scale integration. Also, for commercialization of ReRAM, high reliability is required.

DETAILED DESCRIPTION

In general, according to one embodiment, a memory device includes a nanomaterial assembly layer, a first electrode layer and a second electrode layer. The nanomaterial assembly layer is formed of an assembly of a plurality of micro conductors via gaps between the micro conductors. The first electrode layer is provided on the nanomaterial assembly layer. The second electrode layer is provided on the first electrode layer.

In general, according to one other embodiment, a method is disclosed for manufacturing a memory device. The method can include forming a nanomaterial assembly layer formed of an assembly of a plurality of micro conductors via gaps between the micro conductors. The method can include forming a first electrode layer on the nanomaterial assembly layer by depositing a conductive material by a first method in which a coverage is relatively low. In addition, the method can include forming a second electrode layer on the first electrode layer by depositing a conductive material by a second method in which the coverage is relatively high.

Various embodiments will be described hereinafter with reference to the accompanying drawings.

First, a first embodiment will be described.

Figure 1:
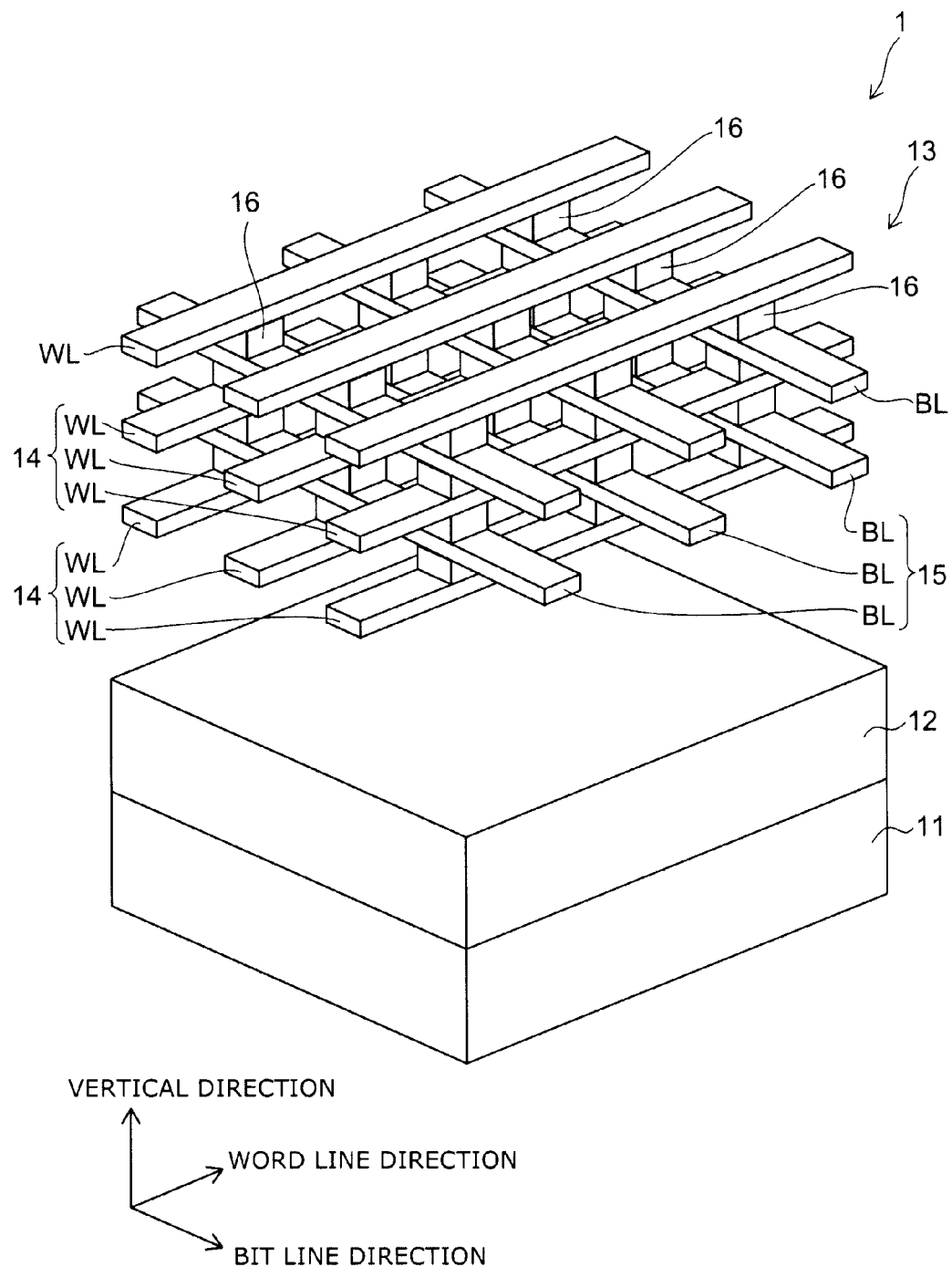
FIG. 1 is a perspective view illustrating a memory device according to a first embodiment.

FIG. 1 is a perspective view illustrating a memory device according to the embodiment.

Figure 2:
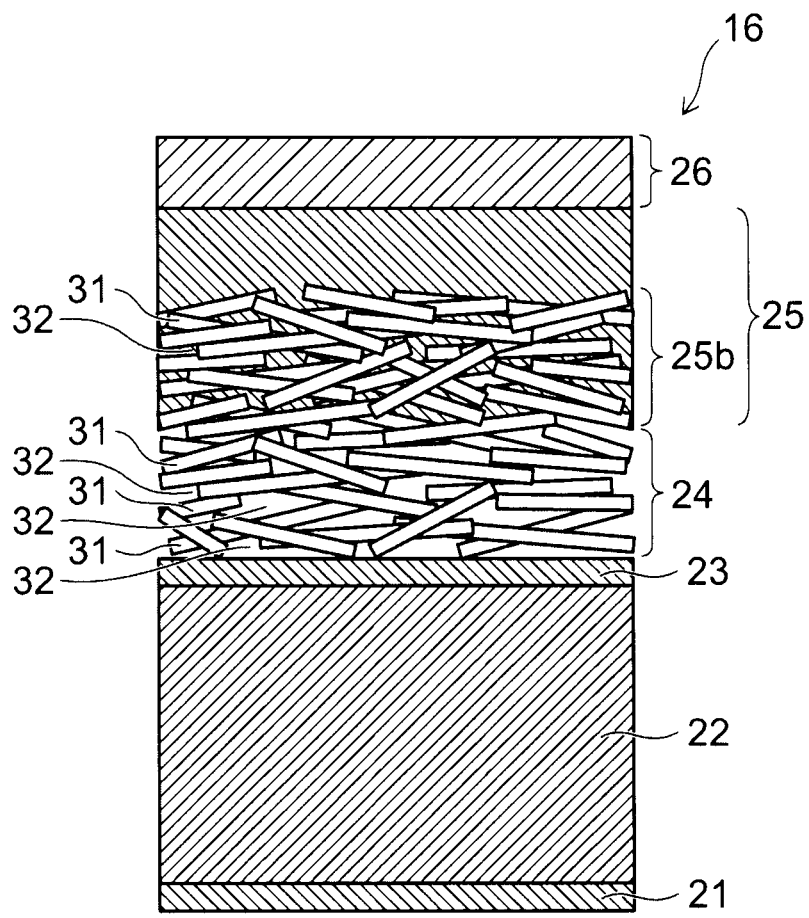
FIG. 2 is a schematic cross-sectional view illustrating a pillar of the first embodiment.

FIG. 2 is a schematic cross-sectional view illustrating a pillar of the embodiment.

The memory device according to the embodiment is a ReRAM.

As illustrated in FIG. 1, in a memory device 1 according to the embodiment, a silicon substrate 11 is provided, and the drive circuit (not illustrated on the drawing) of the memory device 1 is formed on the top layer portion and top surface of the silicon substrate 11. An inter-layer insulating film 12 made from silicon oxide, for example, is provided on the silicon substrate 11 encapsulating the drive circuit, and a memory cell unit 13 is provided on the inter-layer insulating film 12.

In the memory cell unit 13, word line interconnect layers 14 that include a plurality of word lines WL extending in a direction parallel to the top surface of the silicon substrate 11 (hereafter referred to as the "word line direction") and bit line interconnect layers 15 that include a plurality of bit lines BL extending in a direction parallel to the top surface of the silicon substrate 11 and that intersect the word line direction at, for example, right angles (hereafter referred to as the "bit line direction") are stacked alternately, with insulating layers disposed therebetween. Also, there is no contact between word lines WL, between bit lines BL, or between word lines WL and bit lines BL.

Also, pillars 16 extending in the direction normal to the top surface of the silicon substrate 11 (hereafter referred to as the "vertical direction") are provided at the points of closest proximity between each word line WL and each bit line BL. The pillars 16 are formed between word lines WL and bit lines BL. A single memory cell is constituted from a single pillar 16. In other words, a nonvolatile memory device 1 is a cross-point type device in which memory cells are disposed at each of the nearest neighbor of the word lines WL and the bit lines BL. An inter-layer insulating film 17 (see FIGS. 5A and 5B) is embedded between the word lines WL, the bit lines BL, and the pillars 16.

Hereinafter, a configuration of the pillar 16 will be described with reference to FIG. 2.

As illustrated in FIG. 2, in each pillar 16, a barrier metal layer 21, a rectifying element layer 22 that has a rectifying action, a lower electrode layer 23, a nanomaterial assembly layer 24, a low coverage electrode layer 25, and a high coverage electrode layer 26 are stacked subsequently from the bottom up. The low coverage electrode layer 25 and the high coverage electrode layer 26 form an upper electrode layer for the nanomaterial assembly layer 24. The barrier metal layer 21 is in contact with, for example, the word line WL (see FIG. 1), and the high coverage electrode layer 26 is in contact with, for example, the bit line BL (see FIG. 1). Also, a barrier metal layer 29 (see FIGS. 5A and 5B) is provided between the lowermost word line WL and the inter-layer insulating film 12.

The barrier metal layer 29 is a layer for preventing diffusion between the inter-layer insulating film 12 and the word line WL, as well as improving adhesion, and the barrier metal layer 21 is a layer for preventing diffusion between the word line WL and the rectifying element layer 22, as well as improving adhesion. The barrier metal layers 29 and 21 are, for example, formed from a conductive material such as titanium nitride (TiN), tantalum nitride (TaN), tungsten nitride (WN), or the like.

The rectifying element layer 22 is made from, for example, a polysilicon diode layer, with a n-type layer of an n$^+$ conductivity type, an i-type layer made from an intrinsic semiconductor, and a p-type layers of a p$^+$ conductivity type stacked subsequently from the bottom layer side up. In this way, the rectifying element layer 22 functions as a selective element layer in which current only flows when, for example, a potential is supplied to the bit line that is higher than that supplied to the word line WL, and current does not flow in the opposite direction. The lower electrode layer 23 is formed from a conductive material such as tungsten or titanium nitride or the like.

The nanomaterial assembly layer 24 is, for example, an assembly of carbon nanotubes (CNT) 31 as micro conductors, with gaps 32 disposed therebetween. The gaps 32 form an air layer, so the structure of the nanomaterial assembly layer 24 is a hollow structure. The number of layers of CNT 31 stacked in the thickness direction of the nanomaterial assembly layer 24 is, for example, several layers to several tens of layers.

Also, the low coverage electrode layer 25 and the high coverage electrode layer 26 are formed from metal nitrides such as titanium nitride (TiN), tantalum nitride (TaN), tungsten nitride (WN) or the like, or metals such as tantalum (Ta), tungsten (W), molybdenum (Mo), or the like. The low coverage electrode layer 25 and the high coverage electrode layer 26 may be formed from the same type of material, or they may be formed from mutually different types of materials. The thickness of the low coverage electrode layer 25 is, for example, not less than 20 nm, and the thickness of the high coverage electrode layer 26 is, for example, not less than 5 nm. Also, parts of the CNT 31 that constitute the nanomaterial assembly layer 24 are embedded in a lower layer 25b of the low coverage electrode layer 25.

However, the film properties of the low coverage electrode layer 25 and the high coverage electrode layer 26 differ, the coverage of the high coverage electrode layer 26 is higher than the coverage of the low coverage electrode layer 25. Also, when the low coverage electrode layer 25 and the high coverage electrode layer 26 are formed from the same type of material, the density of the high coverage electrode layer 26 is higher than the density of the low coverage electrode layer 25. In addition, the crystalline structure of both the low coverage electrode layer 25 and the high coverage electrode layer 26 is a polycrystalline structure, but the average crystal grain size of the high coverage electrode layer 26 is larger than the average crystal grain size of the low coverage electrode layer 25. Alternatively, the crystalline structure of the low coverage electrode layer 25 may be polycrystalline, and the crystalline structure of the high coverage electrode layer 26 may be an amorphous structure. The differences in these crystalline structures may be confirmed by observing a cross-section of the pillar 16 that includes the vertical direction using a transmission electron microscope (TEM), for example.

As described later, the low coverage electrode layer 25 is formed by a physical vapor deposition (PVD) method, and the high coverage electrode layer 26 is formed by a chemical vapor deposition (CVD) method. Therefore the high coverage electrode layer 26 includes halogen impurities, but the low coverage electrode layer 25 includes substantially no impurities. In other words, the halogen concentration of the high coverage electrode layer 26 is higher than the halogen concentration of the low coverage electrode layer 25.

Next, a method for manufacturing the memory device according to the embodiment will be described.

FIGS. 3A, 3B, 4A, 4B, 5A, and 5B are process cross-sectional views illustrating the method for manufacturing the memory device according to the embodiment.

In FIGS. 3 through 5, the CNT 31 and the gaps 32 are omitted.

First, as illustrated on FIG. 1, the drive circuit for driving the memory cell unit 13 is formed on the surface of the silicon substrate 11. Next, the inter-layer insulating film 12 is formed on the silicon substrate 11. Next, a contact (not illustrated on the drawings) that extends as far as the drive circuit is formed within the inter-layer insulating film 12.

Figure 3A:
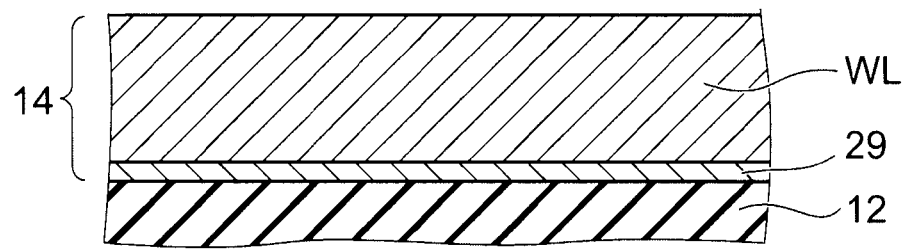
FIGS. 3A to 5B are process cross-sectional views illustrating a method for manufacturing a memory device according to the first embodiment.

Next, as illustrated in FIG. 3A, a plurality of grooves that extend parallel to the word line direction is formed in the top layer portion of the inter-layer insulating film 12. Next, the barrier metal layer 29 is formed on the inner faces of the grooves. Next, the word lines WL are formed by embedding tungsten within the grooves. A plurality of word lines WL is formed, mutually parallel in the word line direction. The word line interconnect layer 14 is formed by the plurality of word lines WL.

Figure 3B:
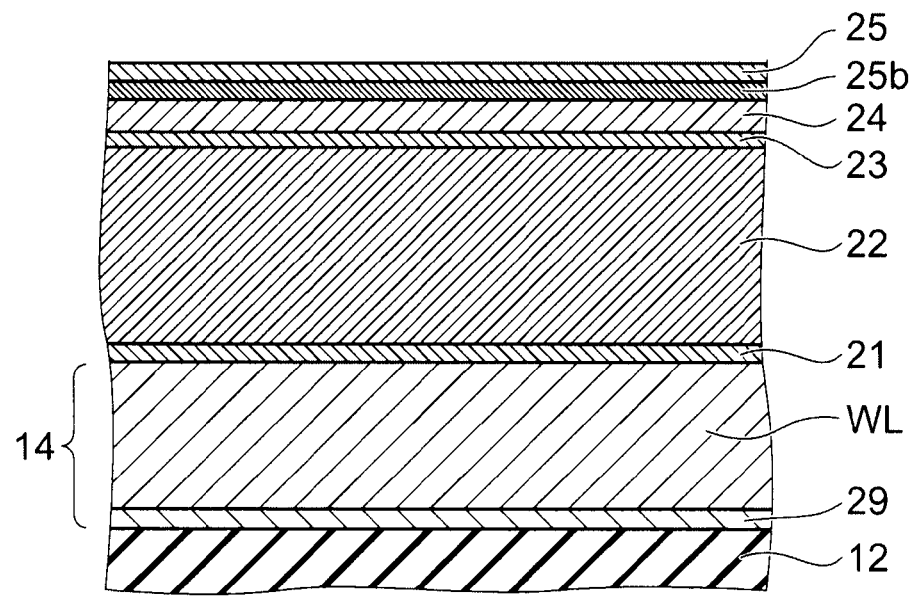

Next, as illustrated in FIG. 3B, a conductive material such as titanium nitride (TiN), tantalum nitride (TaN), tungsten nitride (WN) or the like is deposited on the word line interconnect layer 14 by, for example, the sputtering method to form the barrier metal layer 21. Next, amorphous silicon is deposited on the barrier metal layer 21 by, for example, the low pressure chemical vapor deposition (LP-CVD) method. At this time, each of the impurities is introduced while depositing the amorphous silicon, to continuously form the n-type layer, the i-type layer, and the p-type layer to form the rectifying element layer 22. Next, a conductive material such as tungsten or titanium nitride or the like is deposited on the rectifying element layer 22 to form the lower electrode layer 23.

Next, a dispersion liquid in which the CNTs 31 (see FIG. 2) are dispersed is applied on top of the lower electrode layer 23, and dried. In this way the nanomaterial assembly layer 24 is formed. As illustrated in FIG. 2, in the nanomaterial assembly layer 24, the plurality of CNT 31 are loosely joined, with the gaps 32 formed between the CNT 31. Also, in the process of reducing the thickness by drying the dispersion liquid, the direction of extension of the CNT 31 approaches the horizontal direction, in other words, the direction parallel to the plane formed by the word line direction and the bit line direction.

Next, a conductive material, for example, a metal nitride such as titanium nitride (TiN), tantalum nitride (TaN), tungsten nitride (WN) or the like, or a metal such as tantalum (Ta), tungsten (W), molybdenum (Mo) or the like is deposited on the nanomaterial assembly layer 24 to form the low coverage electrode layer 25. The thickness of the low coverage electrode layer 25 is, for example, not less than 20 nm. Deposition of the conductive material to form the low coverage electrode layer 25 is carried out by a method with relatively low coverage, such as for example the PVD method by, for example, the sputtering method or the deposition method. At this time, a part of the conductive material penetrates into the gaps 32 of the nanomaterial assembly layer 24, but this penetration can be suppressed by depositing the conductive material by a method with a low coverage. For example, the depth of penetration of the conductive material can be reduced to not more than 20 nm. As a result of the penetration of the conductive material into the gaps 32, the CNTs 31 (see FIG. 2) are embedded within the bottom layer 25b of the low coverage electrode layer 25.

Figure 4A:
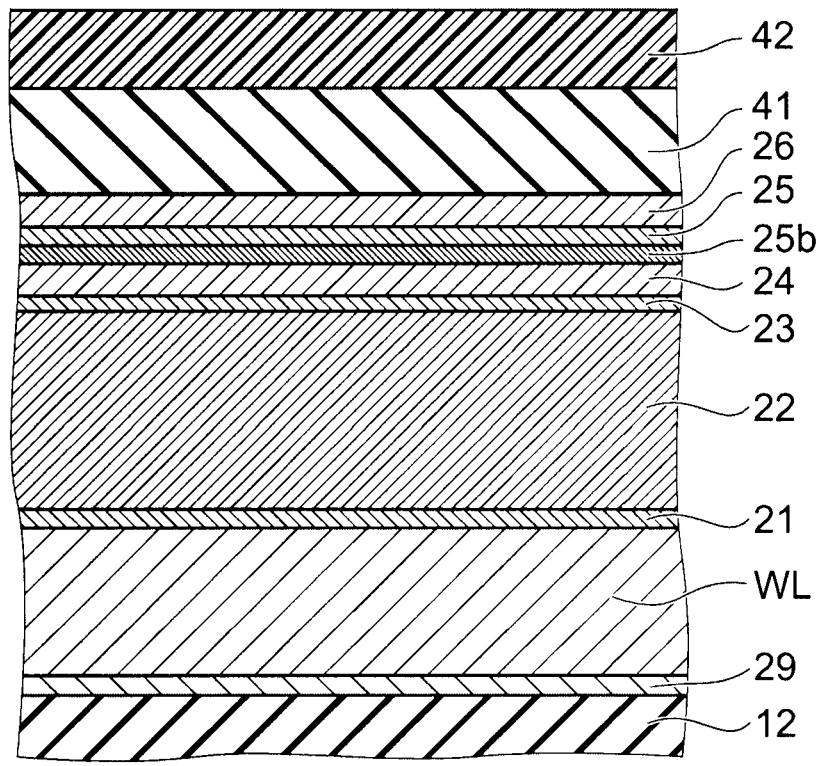

Next, as illustrated in FIG. 4A, the high coverage electrode layer 26 is formed on the low coverage electrode layer 25 by, for example, depositing the same type of conductive material from which the low coverage electrode layer 25 is formed. A material that is different from the conductive material from which the low coverage electrode layer 25 is formed may be deposited. In either case, for example, a metal nitride such as titanium nitride (TiN), tantalum nitride (TaN), tungsten nitride (WN) or the like, or a metal such as tantalum (Ta), tungsten (W), molybdenum (Mo) or the like can be deposited. The thickness of the high coverage electrode layer 26 is, for example, not less than 5 nm.

Deposition of the conductive material for forming the high coverage electrode layer 26 is carried out by a method having a relatively high coverage, for example, by a CVD method such as, for example, the thermal CVD method or the plasma CVD method. By forming the high coverage electrode layer 26 by a method with a high coverage, it is possible to prevent a chemical solution used in the subsequent process, and moisture contained in the layer formed in the process after that, and so on, from penetrating into the nanomaterial assembly layer 24. Also, the low coverage electrode layer 25 is provided between the high coverage electrode layer 26 and the nanomaterial assembly layer 24, so the conductive material that forms the high coverage electrode layer 26 does not penetrate into the nanomaterial assembly layer 24.

If the high coverage electrode layer 26 is formed by the CVD method, impurities such as halogen and the like contained in the source gas of the CVD method will remain within the high coverage electrode layer 26. For example, if the high coverage electrode layer 26 is formed using tungsten (W), tungsten fluoride ($WF_6$) is used as the source gas in the CVD method, so fluorine (F) will remain in the high coverage electrode layer 26. Also, if the high coverage electrode layer 26 is formed using titanium nitride (TiN), titanium chloride ($TiCl_4$) is used as the source gas for the CVD method, so chlorine (Cl) will remain in the high coverage electrode layer 26.

Figure 4B:
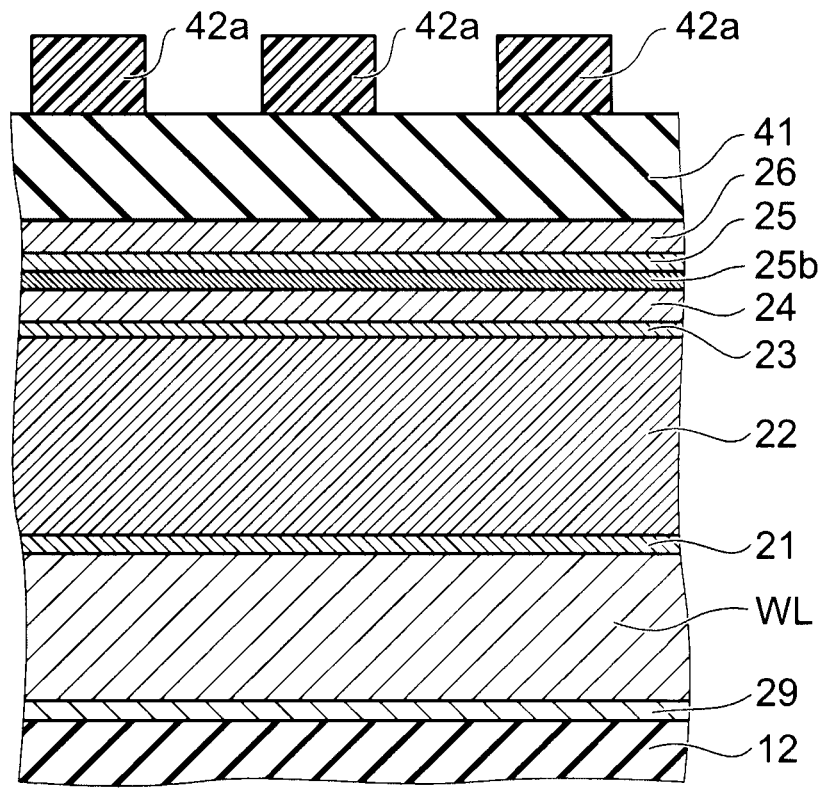
Figure 5A:
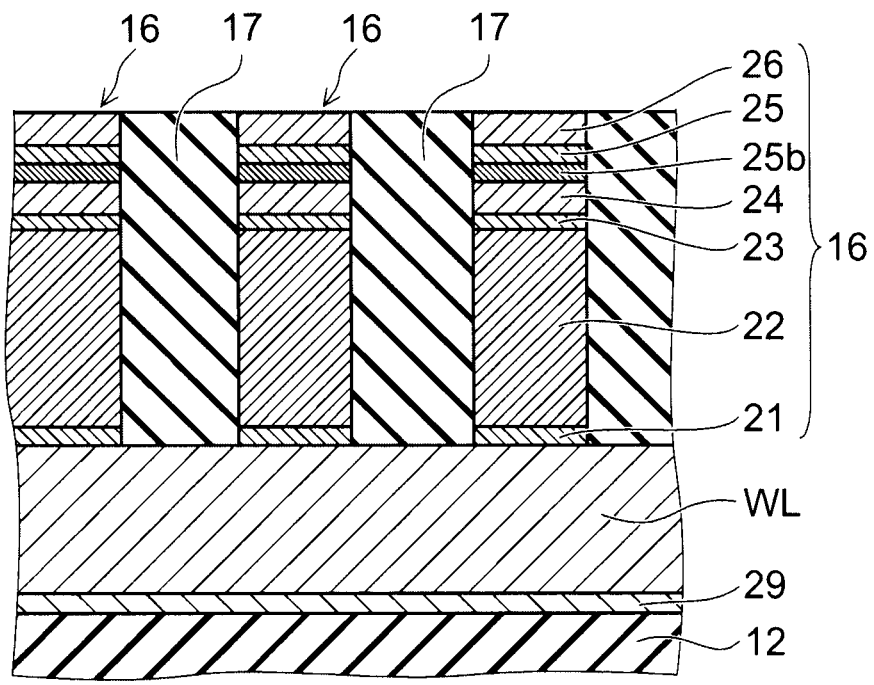

Next, a hard mask 41 made from, for example, silicon oxide is formed on the high coverage electrode layer 26. Next, a resist film 42 is formed on the hard mask 41. Next, as illustrated in FIG. 4B, the resist film 42 is patterned using the lithography method to form a resist pattern 42a. Then, the processes illustrated in FIG. 5A are carried out when the resist pattern 42a is formed properly. On the other hand, if a defect occurs in the resist pattern 42a, for example, if the shift of the resist pattern 42a exceeds the allowable range, a rework process is carried out. The rework process includes removing the resist pattern 42a with the defect, and re-forming a new resist pattern 42a.

In other words, if a defect occurs in the resist pattern 42a formed in the process illustrated in FIG. 4B, a wet process using for example a chemical solution that includes sulfuric acid and hydrogen peroxide solution is carried out, and the resist pattern 42a is removed. Then, a new resist film 42 is formed as illustrated in FIG. 4A. Next, as illustrated in FIG. 4B, the resist film 42 is patterned to form a new resist pattern 42a. If a defect also occurs in the newly formed resist pattern 42a, the process of removing the resist pattern 42a, the process of forming the resist film 42, and the process of forming the resist pattern 42a as described above are carried out again.

Then, when a resist pattern 42a with no defect has been formed, the hard mask 41 (see FIGS. 4A and 4B) is patterned using the resist pattern 42a (see FIG. 4B) as a mask, as illustrated in FIG. 5A. Next, etching such as reactive ion etching (RIE) or the like is carried out using the patterned hard mask 41 as the mask, and the high coverage electrode layer 26, the low coverage electrode layer 25, the nanomaterial assembly layer 24, the lower electrode layer 23, the rectifying element layer 22, and the barrier metal layer 21 are selectively removed. In this way, the pillar 16 is formed.

Next, using for example a hydrofluoric acid-based chemical solution, for example diluted hydrofluoric acid (DHF) or buffered hydrofluoric acid (BHF), wet cleaning is carried out and by-products (not illustrated on the drawings) adhering to the side surfaces of the pillars 16 are removed. Next, silicon nitride, for example, is deposited, and a side wall (not illustrated on the drawings) is formed on the side surface of the pillars 16. Next, an insulating material such as silicon oxide or silicon nitride or the like is deposited to fill in between the pillars 16 to form the inter-layer insulating film 17. Next, chemical mechanical polishing (CMP) is carried out using the high coverage electrode layer 26 as a stopper, and the top surface of the inter-layer insulating film 17 is flattened. At this time, the high coverage electrode layer 26 remains with a thickness of not less than 5 nm.

Figure 5B:
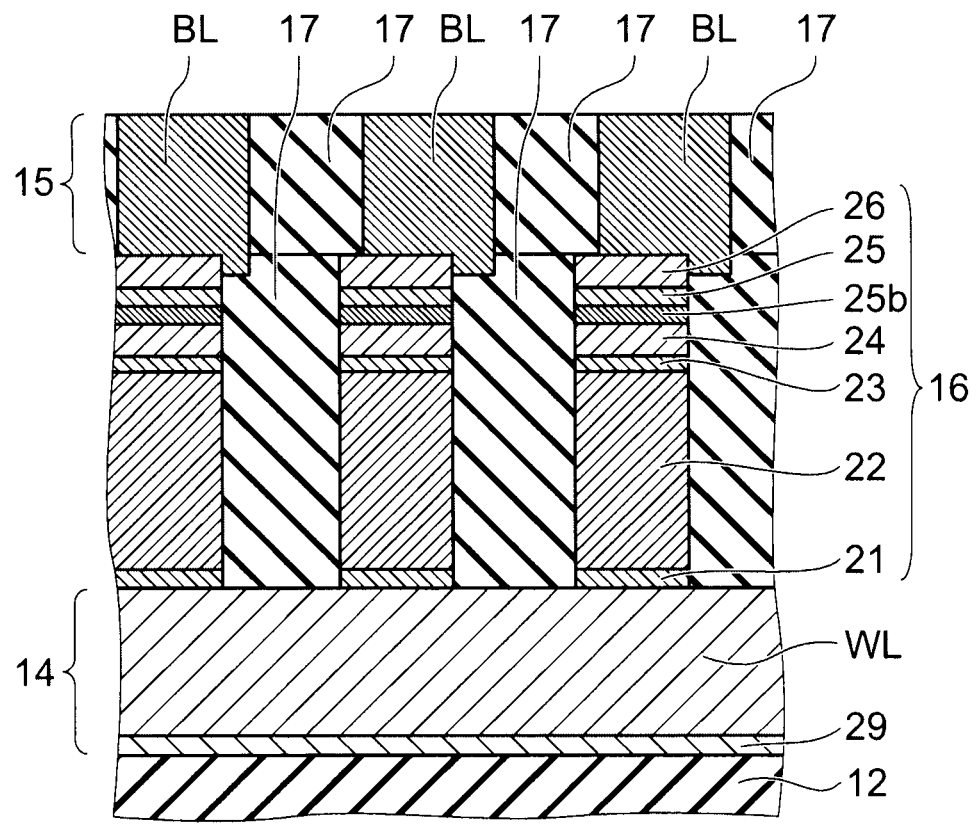

Next, as illustrated in FIG. 5B, a plurality of bit lines BL is formed on the high coverage electrode layer 26. The bit line interconnect layer 15 is formed by the plurality of bit lines BL extending in the bit line direction. Next, the barrier metal layer 21, the rectifying element layer 22, the lower electrode layer 23, the nanomaterial assembly layer 24, the low coverage electrode layer 25, and the high coverage electrode layer 26 are deposited in that sequence by a method similar to that described above, patterning is carried out and the pillars 16 are formed, cleaning is carried out, the side wall is formed, and filling in with the inter-layer insulating film 17 is carried out. In this way, the pillars 16 are formed on the bit lines BL. When forming the pillars 16, the deposition sequence of the n-type layer, the i-type layer, and the p-type layer on the rectifying element layer 22 is reversed with respect to the pillars 16 formed on the word line WL. Thereafter, the word line interconnect layer 14, the plurality of pillars 16, the bit line interconnect layer 15, and the plurality of pillars 16 are repeatedly formed by the same method. In this way, the memory device 1 according to the embodiment is manufactured.

Next, the operation of the embodiment will be described.

In the memory device 1 according to the embodiment, the nanomaterial assembly layer 24 can have a "high resistance state" and a "low resistance state". The mechanism has not been fully described, but for example, may be considered as follows.

When a voltage is not applied to the thickness direction of the nanomaterial assembly layer 24, the CNT 31 are generally separated from each other, so the nanomaterial assembly layer 24 is in the high resistance state. On the other hand, when a voltage is applied to the thickness direction of the nanomaterial assembly layer 24, Coulomb forces are generated between the CNT 31, and they are drawn together. If this voltage is applied continuously for not less than a fixed period of time, the CNT 31 move and rotate, and adjacent CNT 31 contact, and a current path is formed between the lower electrode layer 23 and the low coverage electrode layer 25 via the plurality of CNT 31. As a result, the nanomaterial assembly layer 24 is in the low resistance state. This state is maintained even if the application of the voltage on the nanomaterial assembly layer 24 is eliminated. Also, if a short pulse voltage in the order of, for example, several nanoseconds is applied in the thickness direction of the nanomaterial assembly layer 24, heat is generated at the contacting portions of the CNT 31, and the CNT 31 separate from each other. As a result, the nanomaterial assembly layer 24 returns to the high resistance state. In this way the nanomaterial assembly layer 24 can have the two states, high resistance state and low resistance state, and as a result binary data can be stored. In order to achieve this operation, it is necessary that an appropriate gap 32 be formed between the CNT 31.

Next, the effect of the embodiment will be described.

According to the embodiment, a resistance change layer is realized by the nanomaterial assembly layer 24 in which the carbon nanotubes (CNT) 31 are assembled, and as a result a ReRAM is realized. In a conventional resistance change layer using metal oxides, the metal oxides are fundamentally insulators, so there was the problem that operation was unstable. In contrast, according to the embodiment, the resistance change layer is formed using CNT which are conductors, so it is possible to operate with a low voltage, and operation is stable. In this way, it is possible to realize a highly reliable memory device.

Also, in the embodiment, when forming the low coverage electrode layer 25 on the nanomaterial assembly layer 24, the conductive material is deposited using a method such as the PVD method with a relatively low coverage. In this way, it is possible to suppress the conductive material from penetrating into the gaps 32 in the nanomaterial assembly layer 24. As a result, it is possible to prevent the conductive material that has penetrated into the gaps 32 from penetrating into the thickness direction of the nanomaterial assembly layer 24, and causing a short circuit. On the other hand, when forming the high coverage electrode layer 26 on the low coverage electrode layer 25, the conductive material is deposited using a method such as the CVD method with a relatively high coverage. In this way the film density of the high coverage electrode layer 26 is high, and pin holes are few. When forming the high coverage electrode layer 26, the low coverage electrode layer 25 exists as a base material, so there is no penetration of the conductive material that forms the high coverage electrode layer 26 into the nanomaterial assembly layer 24.

By forming the high coverage electrode layer 26, it is possible to prevent moisture included in the hard mask 41, moisture included in the resist film 42, and chemical solution or the like used in rework processes from passing through pin holes in the hard mask 41 and pin holes in the low coverage electrode layer 25 and penetrating into the nanomaterial assembly layer 24. In this way, there is no vaporization of moisture or chemical solution or the like that has penetrated into the nanomaterial assembly layer 24 within the nanomaterial assembly layer 24 due to the heat treatment associated with forming the film of the hard mask 41 or baking the resist film 42, and so on, and reactions such as oxidation reactions or the like are not caused. As a result, the nanomaterial assembly layer 24 does not separate due to this vaporization or reaction. Also, there is no variation in the electrical characteristics of the memory cells as a result of non-uniform distribution of the moisture or chemical solution or the like that has penetrated into the nanomaterial assembly layer 24. In this way, it is possible to manufacture a highly reliable memory device 1.

Next, a second embodiment will be described.

Figure 6:
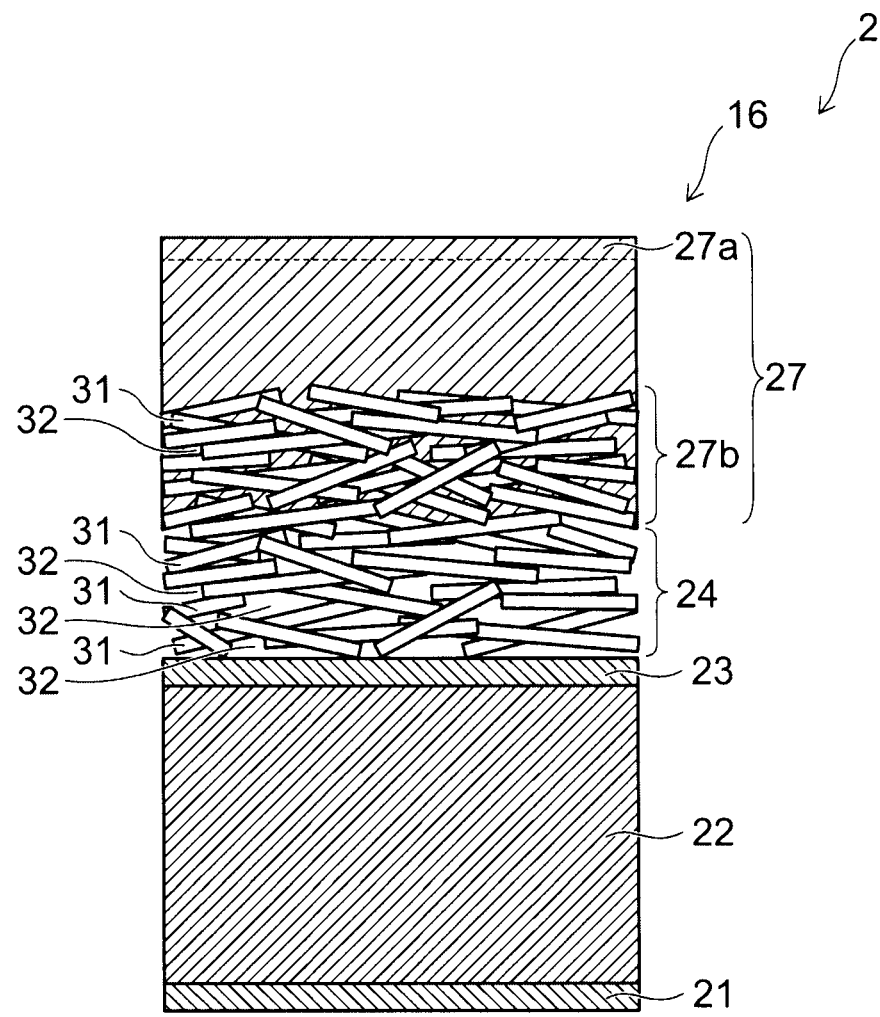
FIG. 6 is a schematic cross-sectional view illustrating a pillar of a second embodiment.

FIG. 6 is a schematic cross-sectional view illustrating a pillar of a memory device according to the embodiment.

As illustrated in FIG. 6, in a memory device 2 according to the embodiment, the configuration of the upper electrode layer of the pillar 16 is different compared with the memory device 1 (see FIGS. 1 and 2) according to the first embodiment as described above.

In other words, in the embodiment, an upper electrode layer 27 is provided instead of the low coverage electrode layer 25 and the high coverage electrode layer 26 (see FIG. 2) in the first embodiment as described above. The upper electrode layer 27 is formed from a metal nitride such as, for example, titanium nitride (TiN), tantalum nitride (TaN), tungsten nitride (WN), or the like, or a metal such as tantalum (Ta), tungsten (W), molybdenum (Mo), or the like. However, the topmost layer portion of the upper electrode layer 27 is nitrided. In FIG. 6, the nitrided portion of the upper electrode layer 27 is indicated as a nitrided portion 27a. In the nitrided portion 27a, mainly the crystal grain boundaries of the upper electrode layer 27 are nitrided. The nitrogen concentration within the upper electrode layer 27 is highest at the top surface of the upper electrode layer 27, and decreases downwards, in other words, towards the nanomaterial assembly layer 24. For convenience of illustration, in FIG. 6, the boundary between the nitrided portion 27a and the other portion in the upper electrode layer 27 is indicated by a broken line, but in reality there is no clear boundary, and the nitrogen concentration continuously changes. Also, CNT 31 that constitute the nanomaterial assembly layer 24 are embedded in a lower layer 27b of the upper electrode layer 27. As described later, the upper electrode layer 27 is a layer that is formed by a method with low coverage, for example the PVD method. The configuration of the embodiment other than that described above is the same as the first embodiment as described previously.

Next, a manufacturing method of the memory device according to the embodiment will be described.

FIGS. 7A, 7B, 8A, 8B, 9A, and 9B are process cross-sectional views illustrating the method for manufacturing the memory device according to the embodiment.

In FIGS. 7 through 9, the CNT 31 and the gaps 32 (see FIG. 6) are omitted from the drawings.

In the method for manufacturing the memory device according to the embodiment, the process of forming the word line interconnect layer 14 and the bit line interconnect layer 15 alternately on the inter-layer insulating film 12 is the same as for the first embodiment as described previously. Also, in the method of forming the pillars 16, the method of forming from the barrier metal layer 21 to the nanomaterial assembly layer 24 is the same as that for the first embodiment. The following is an explanation of the method for manufacturing the memory device according to the embodiment, concentrating on the portions that are different from the first embodiment as described previously.

Figure 7A:
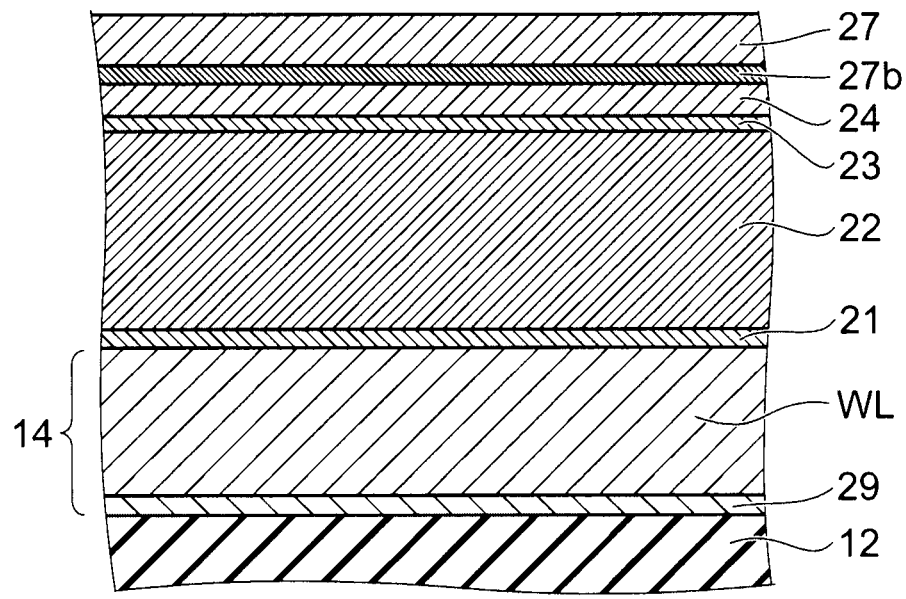
FIGS. 7A to 9B are process cross-sectional views illustrating a method for manufacturing a memory device according to the second embodiment.

As illustrated in FIG. 7A, the barrier metal layer 21, the rectifying element layer 22, the lower electrode layer 23, and the nanomaterial assembly layer 24 are, for example, formed on the word line interconnect layer 14, by a method that is the same as that for the first embodiment as described previously.

Next, the upper electrode layer 27 is formed on the nanomaterial assembly layer 24. The method of forming the upper electrode layer 27 is the same as the method of forming the low coverage electrode layer 25 in the first embodiment. In other words, a conductive material such as titanium nitride (TiN) or the like is deposited using a method with a relatively low coverage, for example a PVD method such as the sputtering method or the deposition method. At this time, a part of the conductive material penetrates into the gaps 32 of the nanomaterial assembly layer 24, but because the deposition is done by a method with a low coverage, it is possible to suppress this penetration. The portion of the conductive material that penetrates into the gaps 32 of the nanomaterial assembly layer 24 becomes the lower layer 27b of the upper electrode layer 27. Conversely, the CNT 31 (see FIG. 2) is embedded within the lower layer 27b of the upper electrode layer 27.

Figure 7B:
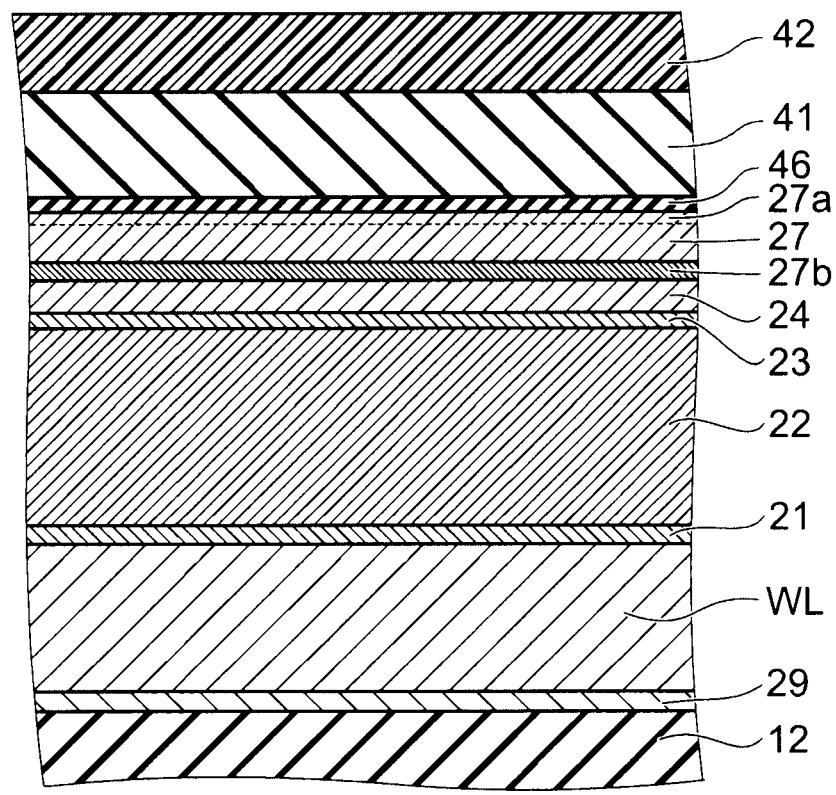

Next, as illustrated in FIG. 7B, silicon nitride is deposited by a method with a relatively high coverage, for example by a CVD method such as the LPCVD method. In this way, a silicon nitride layer 46 is formed on the upper electrode layer 27. The thickness of the silicon nitride layer 46 is, for example, not less than 5 nm. At this time, the nitrogen included in the source gas, which is ammonia (NH$_3$) diffuses mainly into the upper electrode layer 27 via the crystal grain boundaries, forming the nitrided portion 27a in the topmost layer of the nitrided portion 27a. Next, a hard mask 41 made from silicon oxide, for example, is formed on the silicon nitride layer 46. Next, the resist film 42 is formed on the hard mask 41.

Figure 8A:
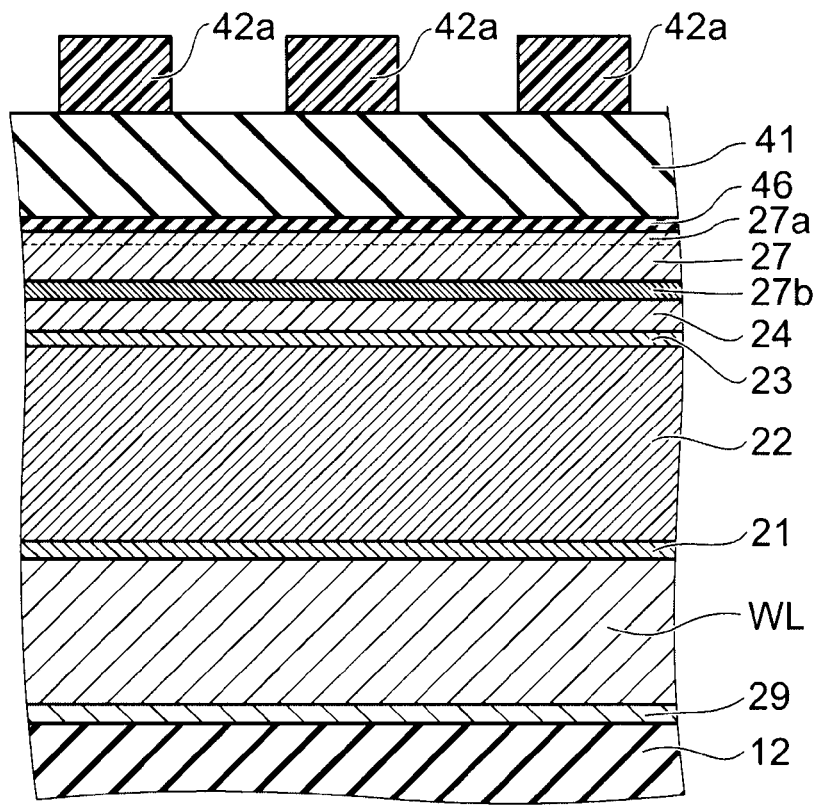
Figure 8B:
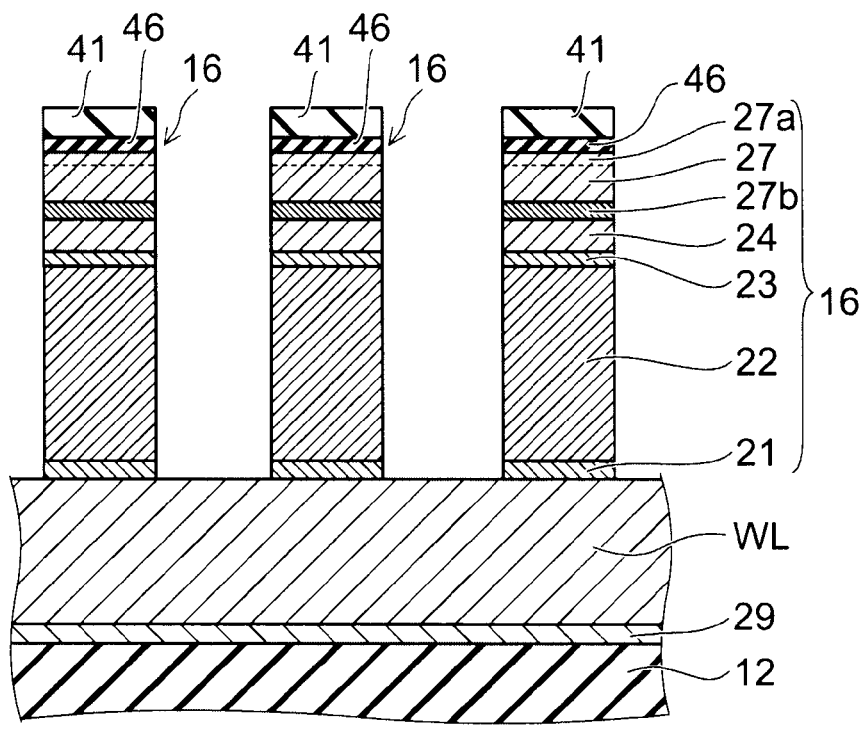

Next, as illustrated in FIG. 8A, the resist film 42 is patterned by the lithography method, to form the resist pattern 42a. Then, if the resist pattern 42a is properly formed, the process illustrated in FIG. 8B is performed. On the other hand, if a defect occurs in the resist pattern 42a, for example, if the positional deviation of the resist pattern 42a is outside the permitted range, a rework process is carried out. Specifically, after the resist pattern 42a is removed by a wet process using a chemical solution, the resist film 42 illustrated in FIG. 7B is formed, and the resist pattern 42a illustrated in FIG. 8A is formed again.

Then, if a proper resist pattern 42a is formed, as illustrated in FIG. 8B, the hard mask 41 is patterned using the resist pattern 42a as a mask, and etching such as RIE or the like is carried out using the patterned hard mask 41 as the mask. In this way, the silicon nitride layer 46, the upper electrode layer 27, the nanomaterial assembly layer 24, the lower electrode layer 23, the rectifying element layer 22, and the barrier metal layer 21 are selectively removed to form the pillars 16. Next, the pillars 16 are cleaned, and the side walls (not illustrated on the drawings) are formed.

Figure 9A:
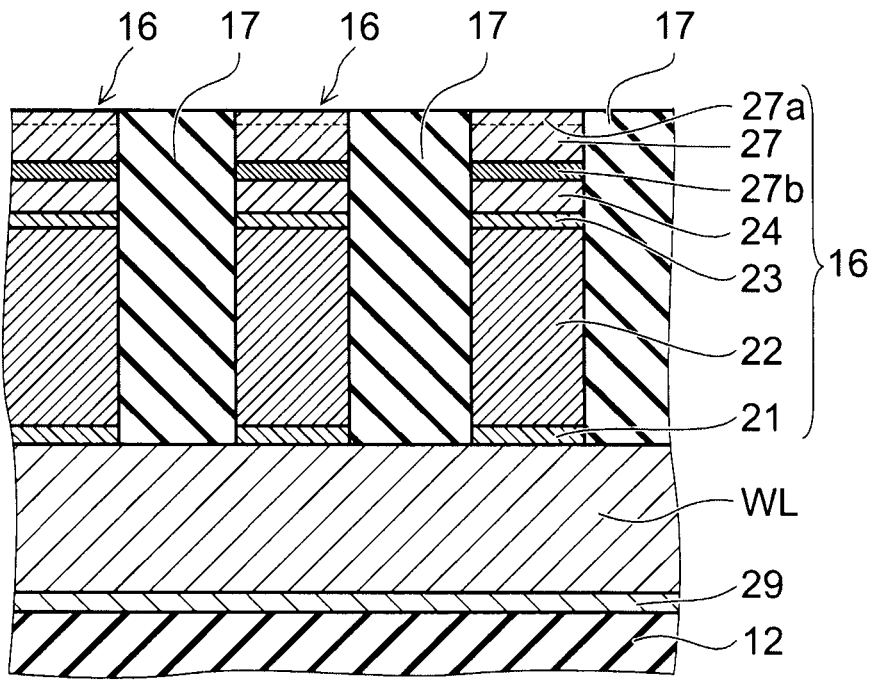
Figure 9B:
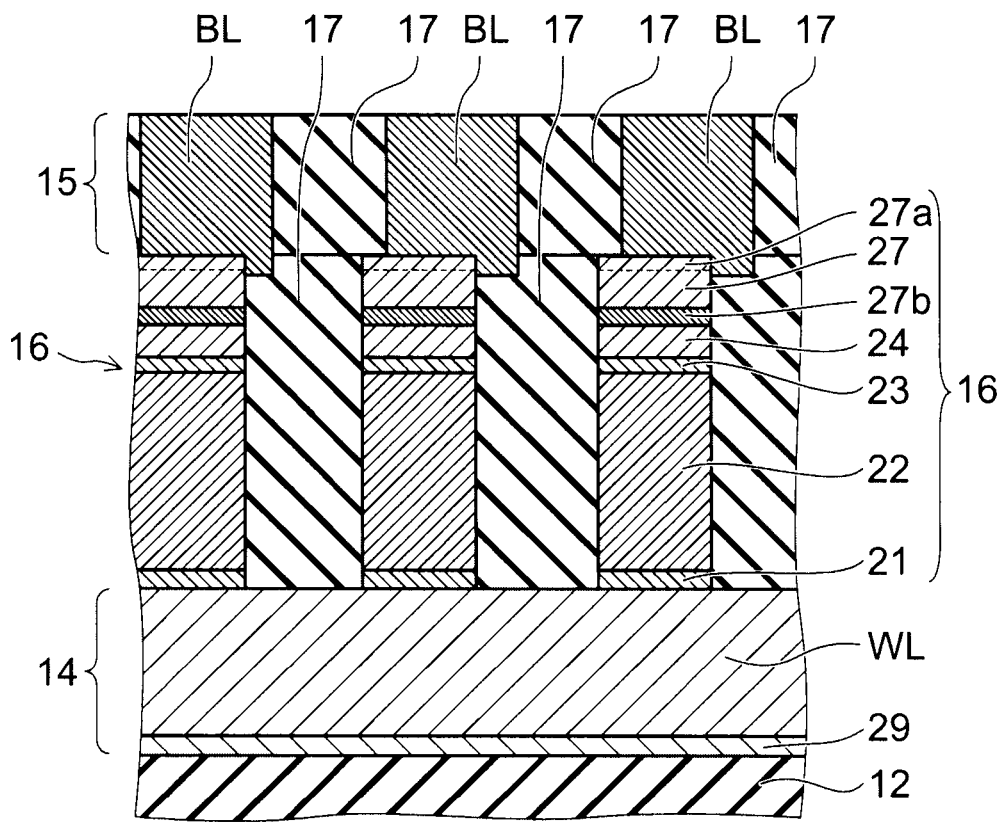

Next, as illustrated in FIG. 9A, an insulating material such as silicon oxide or silicon nitride or the like is deposited thereby embedding the pillars 16, and thus forming the inter-layer insulating film 17. Next, a flattening process such as CMP or the like is carried out using the upper electrode layer 27 as a stopper, to flatten the top surface of the inter-layer insulating film 17. In this way, the top of the inter-layer insulating film 17 is removed together with the hard mask 41 and the silicon nitride layer 46 (see FIGS. 8A and 8B), and the upper electrode layer 27 is exposed. At this time all the silicon nitride layer 46 is removed, but the nitrided portion 27a of the upper electrode layer 27 remains. Next, as illustrated in FIG. 9B, the plurality of bit lines BL is formed on the pillars 16 to form the bit line interconnect layer 15. The manufacturing method according to the embodiment apart from the above is the same as the first embodiment as described previously.

Next, the effect of the embodiment will be described.

In the embodiment, when forming the upper electrode layer 27 on the nanomaterial assembly layer 24, conductive material is deposited by a method with a relatively low coverage, such as PVD or the like. In this way it is possible to suppress penetration of the conductive material into the gaps 32 of the nanomaterial assembly layer 24. On the other hand, when forming the silicon nitride layer 46 on the upper electrode layer 27, silicon nitride is deposited by a method with a relatively high coverage, such as the CVD method or the like. In this way, the film density of the silicon nitride layer 46 increases, and the number of pin holes decreases. When forming the silicon nitride layer 46, the upper electrode layer 27 exists as a base material, so the silicon nitride does not penetrate into the nanomaterial assembly layer 24.

By forming the silicon nitride layer 46, moisture included in the hard mask 41, moisture included in the resist film 42, and chemical solution used in rework processes can be prevented from passing through pin holes in the hard mask 41 and pin holes in the upper electrode layer 27 and penetrating into the nanomaterial assembly layer 24. The silicon nitride layer 46 is removed by the CMP process illustrated in FIG. 9A, so there is nothing to impede the electrical conductivity of the pillars 16 in the memory device 2 after manufacturing. The operation and effect of the embodiment other than that described above is the same as the first embodiment as described previously.

In the first and second embodiments as described above, examples were given in which carbon nanotubes (CNTs) were used as the micro conductors, but the invention is not limited to this. Carbon nanomaterial having a nanoscale crystalline structure such as fullerene, graphene, carbon nanoribbon, or the like may be used as the micro structural bodies that constitute the nanomaterial assembly layer 24, or nanoscale structural bodies made from a conductive material other than carbon may be used. Also, in the first and second embodiments as described above, examples in which the nanomaterial assembly layer 24 was formed by the spincoat method were described, but the invention is not limited to this, and they can be formed by, for example, the CVD method.

Also, in the first and second embodiments as described above, examples in which a polysilicon diode layer is provided as the rectifying element layer are described, but the invention is not limited to this. It is sufficient that the rectifying element layer be a layer that is capable of selecting whether or not current flows in a pillar 16, for example, it may be a Schottky diode made from a silicon layer and a metal layer, or a silicon transistor layer of npn-type or pnp-type.

According to the embodiment as described above, it is possible to realize a highly reliable memory device and manufacturing method for same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
    a nanomaterial assembly layer formed of an assembly of a plurality of micro conductors via gaps between the micro conductors;
    a first electrode layer provided on the nanomaterial assembly layer; and
    a second electrode layer provided on the first electrode layer;
    wherein an average crystal grain size of the second electrode layer is larger than an average grain size of the first electrode layer.

2. A memory device, comprising:
    a nanomaterial assembly layer formed of an assembly of a plurality of micro conductors via gaps between the micro conductors;
    a first electrode layer provided on the nanomaterial assembly layer; and
    a second electrode layer provided on the first electrode layer;
    wherein the first electrode layer has a polycrystalline structure, and the second electrode layer has an amorphous structure.

3. A memory device, comprising:
a nanomaterial assembly layer formed of an assembly of a plurality of micro conductors via gaps between the micro conductors;
a first electrode layer provided on the nanomaterial assembly layer; and
a second electrode layer provided on the first electrode layer;
wherein a halogen concentration of the second electrode layer is higher than a halogen concentration of the first electrode layer.

4. A memory device, comprising:
a nanomaterial assembly layer formed of an assembly of a plurality of micro conductors via gaps between the micro conductors;
a first electrode layer provided on the nanomaterial assembly layer; and
a second electrode layer provided on the first electrode layer;
wherein the first electrode layer and the second electrode layer are formed from one type of material, and
a density of the second electrode layer is higher than a density of the first electrode layer.

5. A memory device, comprising:
a nanomaterial assembly layer formed of an assembly of a plurality of micro conductors via gaps between the micro conductors; and
an electrode layer provided on the nanomaterial assembly layer,
a topmost layer of the electrode layer being nitrided, and
a nitrogen concentration within the electrode layer being highest at the top surface of the electrode layer, and decreasing towards the nanomaterial assembly layer.

6. The device according to claim 5, further comprising:
a word line interconnect layer that includes a plurality of word lines extending in a first direction; and
a bit line interconnect layer that includes a plurality of bit lines extending in a second direction intersecting the first direction,
the word line interconnect layer and the bit line interconnect layer being alternately stacked, and
the nanomaterial assembly layer and the electrode layer forming pillars stacked between each of the word lines and each of the bit lines.

* * * * *